United States Patent [19]
Meyer

[11] Patent Number: 5,481,499
[45] Date of Patent: Jan. 2, 1996

[54] INTEGRATED MATRIX MEMORY, COMPRISING A CIRCUIT ARRANGEMENT FOR TESTING THE ADDRESSING

[75] Inventor: Peter Meyer, Gudow, Germany

[73] Assignee: U.S. Philips Corporation, New York, N.Y.

[21] Appl. No.: 405,566

[22] Filed: Mar. 16, 1995

Related U.S. Application Data

[63] Continuation of Ser. No. 324,453, Oct. 17, 1994, which is a continuation of Ser. No. 93,220, Jul. 16, 1993.

[30] Foreign Application Priority Data

Jul. 17, 1992 [DE] Germany ............ 42 23 532.4

[51] Int. Cl.$^6$ .................................. G11C 29/00
[52] U.S. Cl. ............ 365/201; 365/63; 365/230.06; 371/21.1
[58] Field of Search ........... 365/201, 63, 230.06; 371/21.1, 21.2, 21.3, 20.4

[56] References Cited

U.S. PATENT DOCUMENTS 4,972,372 11/1990 Ueno ............................ 371/21.2
5,258,954 11/1993 Furuyama .................... 371/21.1

FOREIGN PATENT DOCUMENTS

0480752 4/1992 European Pat. Off. .

*Primary Examiner*—David C. Nelms
*Assistant Examiner*—Vu A. Le
*Attorney, Agent, or Firm*—Laurie E. Gathman

[57] ABSTRACT

Matrix memories comprising row conductors and column conductors, at the intersections of which storage elements are arranged, are often tested by complete addressing of all elements. Different bit patterns are written into the memory and tested upon reading. However, when the elements arranged at the intersections are EEPROM storage cells, requiring a substantial amount of time for writing, the complete testing of the memory in this manner would be very time consuming. In accordance with the invention, therefore, only the addressing of the matrix is tested, use being made of a special test bus which can be connected to the row conductors and the column conductors via switches. As a result, not only the row conductors and column conductors themselves, but also the associated decoders and selection elements can be tested for correct operation. This principle can be applied also in the case of memories consisting of several parallel matrices, for example for memories with multibit data words, and for memories in which the matrices are subdivided into a plurality of submatrices.

16 Claims, 4 Drawing Sheets

INTEGRATED MATRIX MEMORY, COMPRISING A CIRCUIT ARRANGEMENT FOR TESTING THE ADDRESSING

This is a continuation of application Ser. No. 08/324,453, filed Oct. 17, 1994 which is a continuation of Ser. No. 08/093,220 filed Jul. 16, 1993.

BACKGROUND OF THE INVENTION

The invention relates to an integrated matrix memory including a circuit arrangement for testing the addressing of the matrix. The matrix includes elements which are arranged at intersections of row conductors and column conductors, wherein the addressing takes place by way of a multibit address via a decoder. The decoder has at least one row decoder and one column decoder each of which is conceived to receive and decode a different pan of the address bits and to drive each time a different row conductor to or select at least one column conductor, via selection switches, for connection to at least one output terminal.

The storage elements arranged at the intersections of row conductors and column conductors in integrated semiconductor matrix memories are constructed in various ways. After manufacturing storage elements which can be read as well as written at a high speed, the memory is generally tested such that various bit patterns are written into the storage cells and read again, the bit patterns read being tested for correctness. The testing of the addressing of such memories is, therefore, indirect. Memories of this kind, however, generally lose their contents when the supply voltage is interrupted. An example of memories which save their contents in the absence of a supply voltage are the so-called programmable memories whose contents can be written once, after which they cannot easily be modified if at all. For such memories it would be effective to test, prior to the time-consuming writing of the contents, whether the separate addressing of the individual storage elements functions correctly, so that faulty memories can be rejected prior to writing. Another example of such memories, referred to as EEPROM's which have contents which can be electrically modified but are saved after interruption of the supply voltage. The writing and erasure of such memories, however, requires a substantial mount of time so that the writing of different bit patterns with subsequent reading and testing is very time consuming. Prior testing of the correct operation of the addressing of the individual storage elements would also be very efficient for such memories.

From EP-480 752 A1 there is known a circuit arrangement for testing semiconductor matrix memories with respect to of short circuits between neighboring leads. To this end, a signal is applied to every second row conductor or every second column conductor and it is tested whether this signal occurs, or a current flows, in the intermediate row conductors or column conductors. Such a test, however, is imperfect because it is not suitable to determine interruptions in the leads and because the decoder is not tested.

SUMMARY OF THE INVENTION

It is an object of the invention to provide an integrated matrix memory comprising a circuit arrangement of the kind set forth which enables the testing of the addressing of the matrix, including the decoder, in which short circuits can be detected, not only between neighboring leads, but interruptions of leads can also be detected.

This object is achieved in accordance with the invention in that the memory comprises a test bus and in that at the side of the matrix which is remote from the row decoder each row conductor can be coupled to a different conductor of the test bus and that at the side of the matrix which is remote from the selection switches each column conductor can be coupled to a conductor of the test bus.

The use of the additional test bus, being arranged at the side of the matrix which is remote from the row decoder and the selection switches, respectively, enables complete testing of the addressing for practically all feasible errors. Only the properties of the storage elements arranged at the intersections, i.e. the writability and readability of the individual storage elements per se have not yet been tested in this manner.

The coupling of the row conductors or the column conductors to the test bus must be interrupted during normal operation of the matrix memory, because normal operation of the memory is otherwise impossible. Therefore, an embodiment of the invention is characterized in that each row conductor is coupled to the conductors of the test bus via first test switches and/or each column conductor is coupled to the conductors of the test bus via second test switches, the first test switches and/or the second test switches being drivable by a common test control signal. In principle it suffices to connect switches either only in series with the row conductors or only in series with the column conductors, the respective other coupling then being realized as a direct connection; however, the conductor capacitance of the test bus then loads the conductors with which the permanent connection exists, so that it is generally useful to arrange test switches in series with the row conductors as well as in series with the column conductors, thus completely isolating the test bus during normal operation. Evidently, these test switches are constructed as electronic switches, that is to say normally speaking as field effect transistors, because notably matrix memories are also constructed by means of such transistors.

Instead of only one matrix, semiconductor memories often comprise several matrices which are controlled in a combined manner, each matrix being allocated a given bit of a parallel memory word. In order to enable extensive testing of the addressing also in such cases, an embodiment of the matrix memory in accordance with the invention which comprises several matrices in which the row conductors of at least some of the matrices, starting from the row decoder, are connected in series and one of the column conductors in each matrix can be simultaneously selected by the column decoder and connected to an own output terminal for each matrix, is characterized in that the conductors of the test bus can be coupled to the column conductors of all matrices, the assignment of the individual conductors of the test bus to the column conductors being different for at least some matrices. Because the column conductors of all matrices can be coupled to the conductors of the test bus, complete testing of all column conductors is possible. The additional step of differentiating the assignment between conductors of the test bus and column conductors for different matrices enables the recognition of even further errors.

In the case of memories having a very high capacity, storing a multibit data word at each address and each bit being assigned to a matrix, each matrix is subdivided into a plurality of sub-matrices in order to facilitate control. The entire storage arrangement then consists of a matrix of sub-matrices, the row conductors then traversing each time one row of sub-matrices and the column conductors traversing each time one column of sub-matrices. In order to enable as complete as possible testing of the addressing also in such a case, a further embodiment of the matrix memory in accordance with the invention, in which each matrix comprises the same number of sub-matrices, the row conductors of the sub-matrices are controlled in parallel and a block decoder is provided to activate each time only one sub-matrix in each matrix, is characterized in that the row conductors of the sub-matrices can be coupled to the conductors of the test bus via third test switches which are controlled by the block decoder, the allocation of the relevant row conductor to the conductors of the test bus being different for at least some sub-matrices. This requires the use of test switches in series with the row conductors as well as in series with the column conductors. However, because all test switches are controlled in parallel and it is necessary in this arrangement to test the row conductors of the individual rows of sub-matrices separately, the third test switches are required. Because these said test switches are required only for the test, they are also arranged preferably at the side of the relevant row of sub-matrices which is remote from the row decoder. A further embodiment of the memory in accordance with the invention, therefore, is characterized in that the third test switches are connected in series with the first test switches. This also enables a simple construction.

In the case of large matrices it is effective to subdivide the matrices in order to shorten the conductors and to arrange the row decoders between the matrices so that the row conductors from the decoder to the respective last matrix are shorter accordingly. In order to enable effective testing of the addressing also in this case, a further embodiment of the matrix memory in accordance with the invention, in which the matrices are distributed between two equally large groups, the row decoders are arranged between the two groups and control the row conductors for both groups in parallel, is characterized in that at the sides of both groups of matrices which are remote from the row decoder there is provided a respective test bus, it being possible to couple each test bus at least to the column conductors of a part of the matrices. The entire matrix arrangement including the test bus, thus consists of two parts which are practically a minor image of one another. This also saves design work for the practical implementation of such a matrix arrangement.

BRIEF DESCRIPTION OF THE DRAWINGS

Embodiments of the invention will be described in detail hereinafter with reference to the drawing. Therein.

DETAILED DESCRIPTION OF THE PREFERRED EMBODIMENT

Figure 1A:
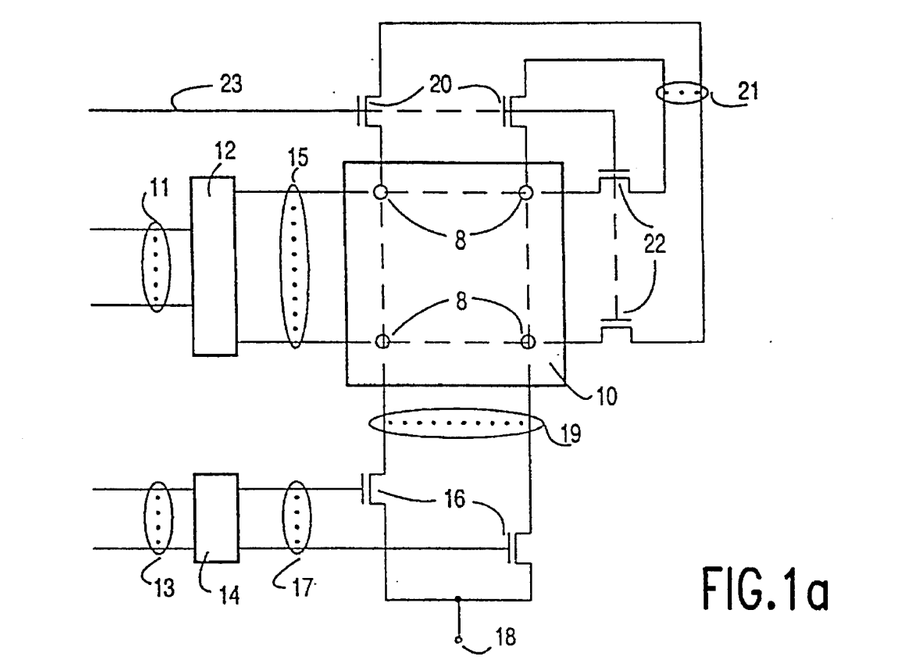
FIG. 1a shows the circuit arrangement in accordance with the invention for a simple matrix.

FIG. 1a shows diagrammatically a matrix 10 which is traversed by a number of row conductors 15, only the first and the last row conductor being shown for the sake of clarity. A number of column conductors 19, only the first and the last one of which are shown again for the sake of clarity, traverses the matrix 10 perpendicularly to the row conductors 15. At the intersections of the row conductors 15 and the column conductors 19 there are arranged elements 8. In the present example these elements are assumed to be EPROM storage cells whose construction is known per se and not significant for a proper understanding of the invention, so that these elements will not be elaborated upon herein. Furthermore, supply voltages are required for operation of the elements; these voltages, however, are not shown either.

The row conductors 15 are driven by a row decoder 12 which receives a portion of the bits of a multibit address via the input leads 11 and which decodes these bits so that each time only one of the row conductors 15 is driven.

Via switches, shown as field effect transistors 16, the column conductors 19 are connected to a common output 18. The transistors 16 are driven via selection leads 17 which are connected to outputs of a column decoder 14. Via the input leads 13, the column decoder 14 receives the remaining bits of the multibit address and decodes these bits so that each time only one selection lead 17 is driven. The stored contents of a storage cell 8, arranged at the intersection of a row conductor 15 and a column conductor 19, are thus output on the output 18. A condition to be satisfied in this respect is that indeed only a single row conductor 15 is driven by the row decoder 12 and that this row conductor 15 extends without interruption to the last elements 8 of the matrix 10 and is not short-circuited to another row conductor or other conductor, for example a column conductor. Similarly, each column conductor 19 should also extend from the upper element 8 to the lower output of the matrix 10 and should not be interrupted or short-circuited to any other column conductor or any other conductor and, moreover, only one of the selection transistors 16 may be rendered conductive, i.e. the column decoder 14 may drive each time only one of the selection leads 17.

In order to test the foregoing, various bit patterns can be written into the matrix 10 and be read therefrom again in order to test their correspondence to the bit patterns written. Because EEPROM storage cells require a substantial period of time for writing, notably in the case of a large matrix 10 comprising many row conductors and column conductors a substantial period of time would be required for the test. Therefore, the arrangement comprising the matrix 10 and the decoders 12 and 14 as shown in FIG. 1a is provided with an additional test circuit which comprises a test bus 21 with a number of conductors. Via switches, again shown as field effect transistors 22 and 20, the conductors of the test bus 21 are connected to the row conductors 15 at the side of the matrix 10 which is remote from the row decoder 12, and to the column conductors 19 at the side of the matrix 10 which is remote from the selection transistors 16.

For the testing of the addressing, all transistors 20 and 22 are turned on by an appropriate signal on the test lead 23, after which all feasible address bit combinations are successively applied, via the leads 11 and 13, to the row decoder 12 and the column decoder 14, for each bit combination on the inputs 11 all bit combinations of the inputs 13 being generated or, conversely, for each bit combination on the inputs 13 all feasible bit combinations being generated on the inputs 11. For each bit combination on the inputs 11 and 13, a signal may appear on the output 18 only for a given bit combination on the inputs 13 and 11. Should a short-circuit exist between two row conductors 15 or should the row decoder 12 simultaneously drive more than one row conductor because of a defect, for a bit combination on the inputs 11 a signal will be generated on the output 18 for a plurality of bit combinations on the inputs 13. The same applies when short-circuits exist between column conductors 19 or between selection leads 17 or when the column decoder 14 drives more than one selection lead 17 simultaneously because of a defect. However, should a row conductor 15 or a column conductor 19 or a selection lead 17 be interrupted, or should the row decoder 12 or the column decoder 14 not generate an output signal for at least one bit combination, or should one of the selection switches 16 be defective, no signal will appear on the output 18 for the corresponding bit combinations on the inputs 11 and 13. Thus, a defect in any pan involved in the addressing can be recognized on the basis of the access signals or missing signals on the output 18.

For the arrangement shown in FIG. 1a it is assumed that the number of row conductors 15 equals the number of column conductors 19. This assumption, however, is not true for all existing matrices. When, on the one hand the number of column conductors 19 announces to, for example twice the number of row conductors 15, being equal to the number of conductors in the test bus 21, each conductor of the test bus 21 can be connected to two column conductors which are preferably spaced far apart in order to enable detection of short-circuits between neighboring column conductors. In that case two signals should appear on the output 18 for each bit combination on the inputs 11 and all bit combinations on the inputs 13.

Figure 1B:
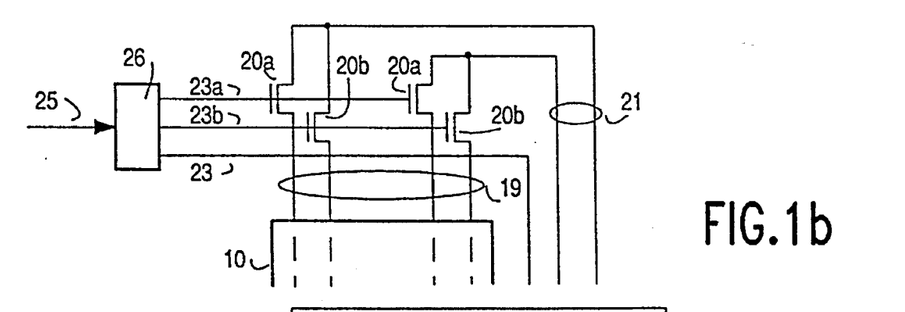
FIGS. 1b and 1c show possibilities for coupling for the cases where the number of row conductors or the number of conductors of the test bus deviates from the number of column conductors.

FIG. 1b illustrates a further possibility where each conductor of the test bus 21 is connected to a different column conductor via two separate transistors 20a and 20b. The transistors 20a and 20b are alternately turned on, via test leads 23a and 23b, by a test arrangement 26 which is controlled via an input 25, the lead 23 each time driving the transistors 22. In that case a signal appears on the output 18 only in the event of an unambiguous combination of address bits on the inputs 11 and 13 and test signals on the leads 23a and 23b.

Figure 1C:
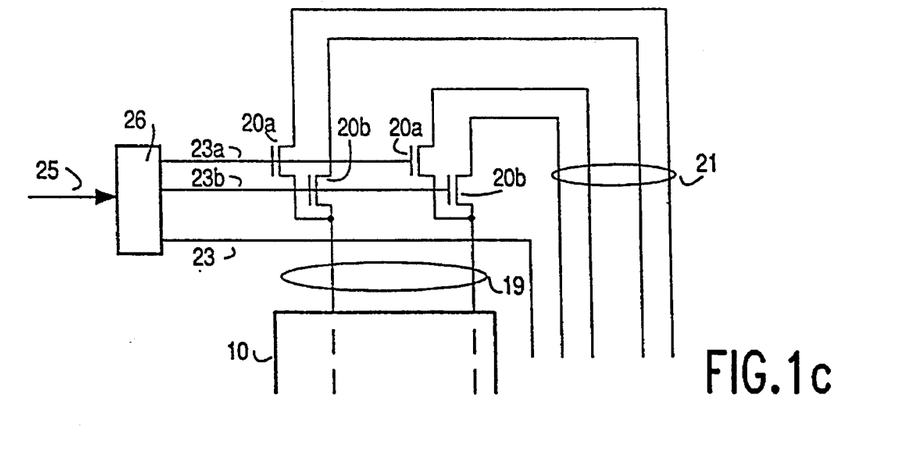

On the other hand, when the number of row conductors 15 is greater than the number of column conductors 19, two or more row conductors can be connected to the same conductor of the test bus 21 which then comprises a number of conductors which is equal to the number of column conductors 19. FIG. 1c shows a further possibility. Therein, each column conductor 19 is connected, via two transistors 20a and 20b, to a different conductor of the test bus 21, the transistors 20a and 20b again being alternately driven, via separate test leads 23a and 23b, respectively, by a test device 26, the lead 23 each time receiving a signal. Again a signal appears on the output 18 only for a given combination of address bits on the inputs 11 and 13 and only for one of the test signals on the leads 23a and 23b.

It will be evident that substantially complete testing of the addressing by means of a test bus is thus also possible in cases where the number of row conductors does not correspond to the number of column conductors.

Many matrix arrangements comprise several, separate matrices which, however, are driven in parallel. This is the case, for example in semiconductor memories in which a multi-bit data word is stored at each address, each bit then being assigned to its own matrix.

Figure 2A:
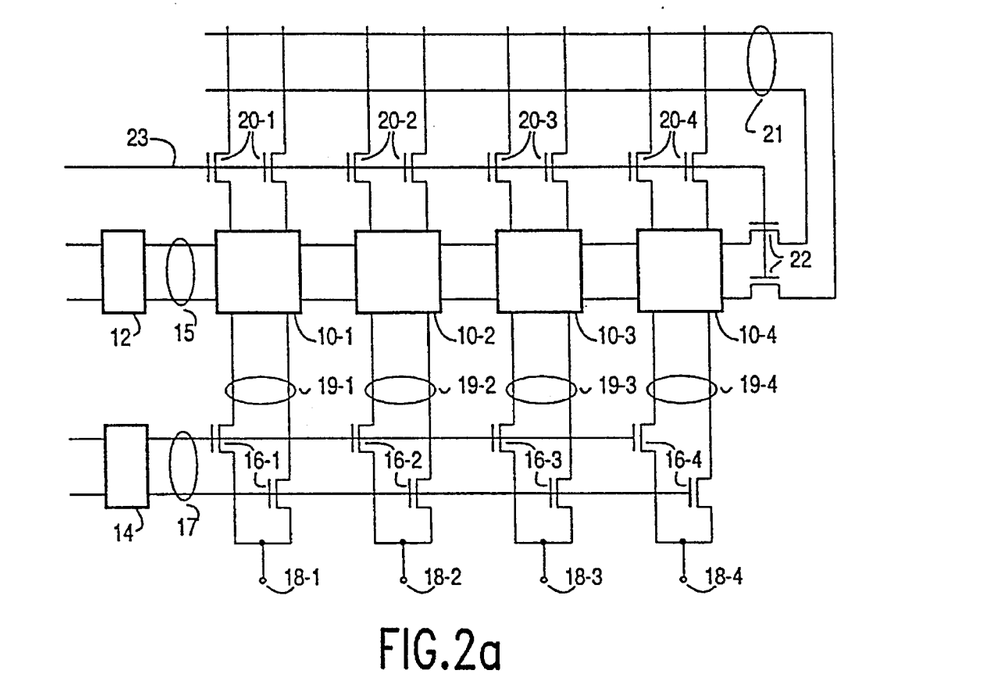
FIG. 2a shows the circuit arrangement in accordance with the invention for a chain of matrices.

FIG. 2a shows the construction principle of such a storage device. This Figure shows four matrices 10-1, 10-2, 10-3 and 10-4 which are of the same construction and which are traversed by the same row conductors 15 which are again driven by the row decoder 12. The column conductors 19-1, 19-2, 19-3 and 19-4 of the individual matrices are connected, via separate selection transistors 16-1, 16.2, 16-3 and 16-4 which are driven by the column decoder 14 via common selection leads 17, to separate outputs 18-1, 18-2, 18-3 and 18-4 for each matrix. When an address is applied to the row decoder 12 and the column decoder 14, therefore, the same element is selected in each matrix 10-1 to 10-4, so that the contents of the same storage element in each matrix appear in parallel on the outputs 18-1 to 18-4.

In the arrangement shown in FIG. 2a, the row conductors 15 are connected, via transistors 22, to the conductors of a test bus 21 at the side of the matrices which is remote from the row decoder 12, i.e. at the output of the matrix 10-4. The conductors of the test bus 21 are connected, via the transistors 20-1, 20-2, 20-3 and 20-4, to the column conductors 19-1 to 19-4 of all matrices. The connection of the conductors of the test bus 21 to the leads connected to the transistors 20-1 to 20-4 is not shown in detail in FIG. 2a and for the time being will be assumed to be for each matrix as shown in FIG. 1a. When all transistors 20-1 to 20-4 and 22 are turned on under the influence of an appropriate signal on the lead 23, for each address bit combination applied to the row decoder 12 a signal appears simultaneously on all outputs 18-1 to 18-4 only for a given address bit combination applied to the column decoder 14, provided that addressing is perfect. In the case of a defect in the row decoder 12 or in the row conductors 14, the same, deviating bit pattern appears on all outputs 18-1 to 18-4. However, when a defect is present in the column conductors of one of the matrices, for example in the column conductors 19-2 of the matrix 10-2, a bit pattern appears on the output 18-2 which deviates from that on the other outputs. Thus, not only a possible defect can be recognized, but at the same time indications of a possible location of the defect appear, which indications can be advantageously used for interventions in the manufacture of such matrix arrangements.

Figure 2B:
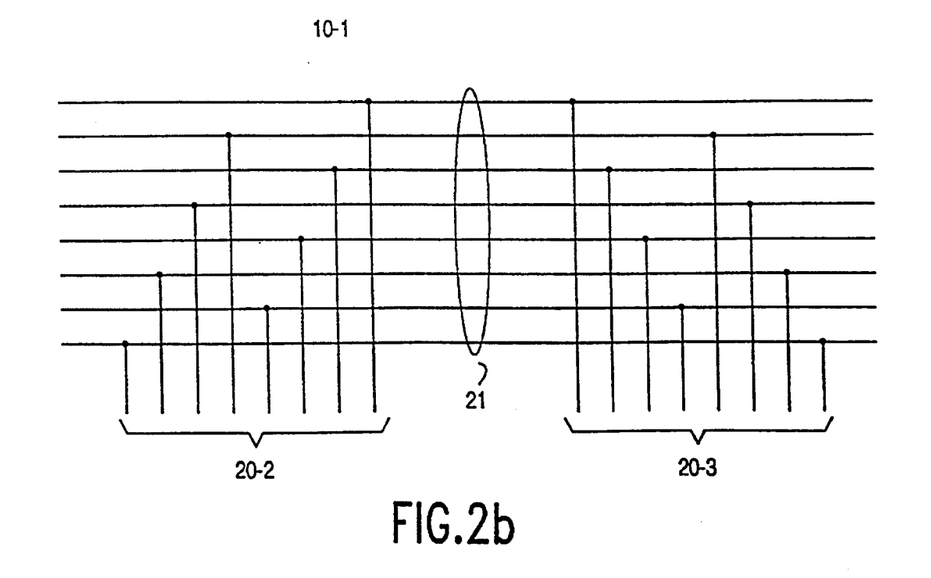
FIG. 2b shows possibilities for different coupling of the column conductors of the individual matrices to the conductors of the test bus.

In order to obtain even more indications of defect locations, if any, and to make non-recognition of given defects more unlikely, the connection of the conductors of the test bus 21 to the leads connected to the transistors 20-1 to 20-4 is preferably different for the individual matrices, such that different conductors of the test bus are connected to the outputs 18-1 to 18-4 via the column conductors of different matrices when particular column conductors are selected. FIG. 2b shows an example in this respect. Therein it is assumed that the test bus 21 comprises eight conductors and that each matrix also comprises eight column conductors. The leads which are connected, for example to the transistors 20-2 in FIG. 2a are connected to the conductors of the test bus 21 in a sequence which deviates from that of the leads connected to the transistors 20-3, i.e. the combination of the connections is shown to be mirrored. Other combinations of connections, however, are also suitable. However, if the number of column conductors exceeds the number of conductors in the test bus 21, a plurality of column conductors which, however, preferably are not directly adjacent, can be connected to the same conductor of the test bus 21, or use can be made of the arrangement shown in FIG. 1b.

Figure 3A:
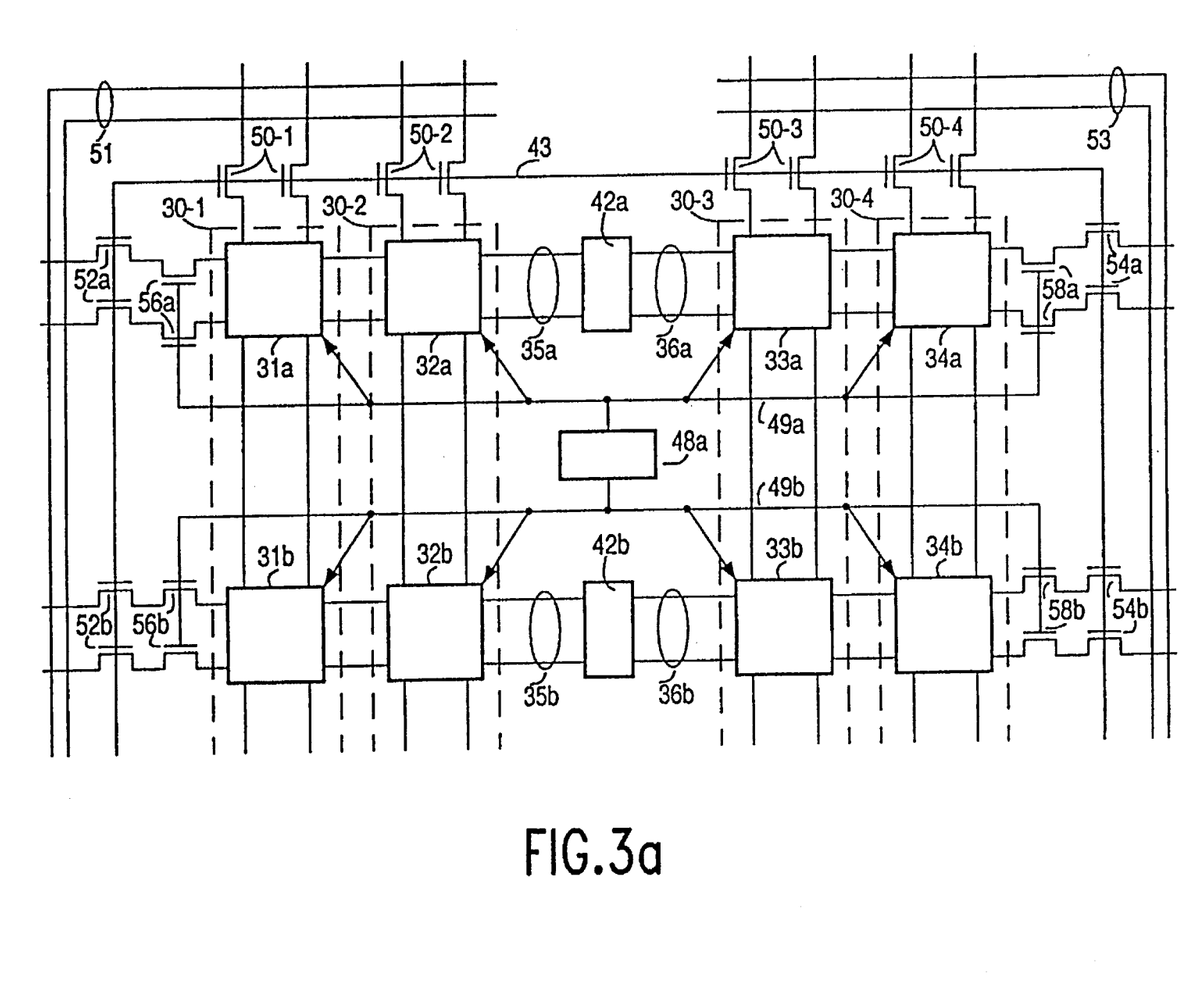
FIGS. 3a and 3b show a circuit arrangement in accordance with the invention which comprises two test buses for a matrix arrangement subdivided into two groups of matrices.
Figure 3B:
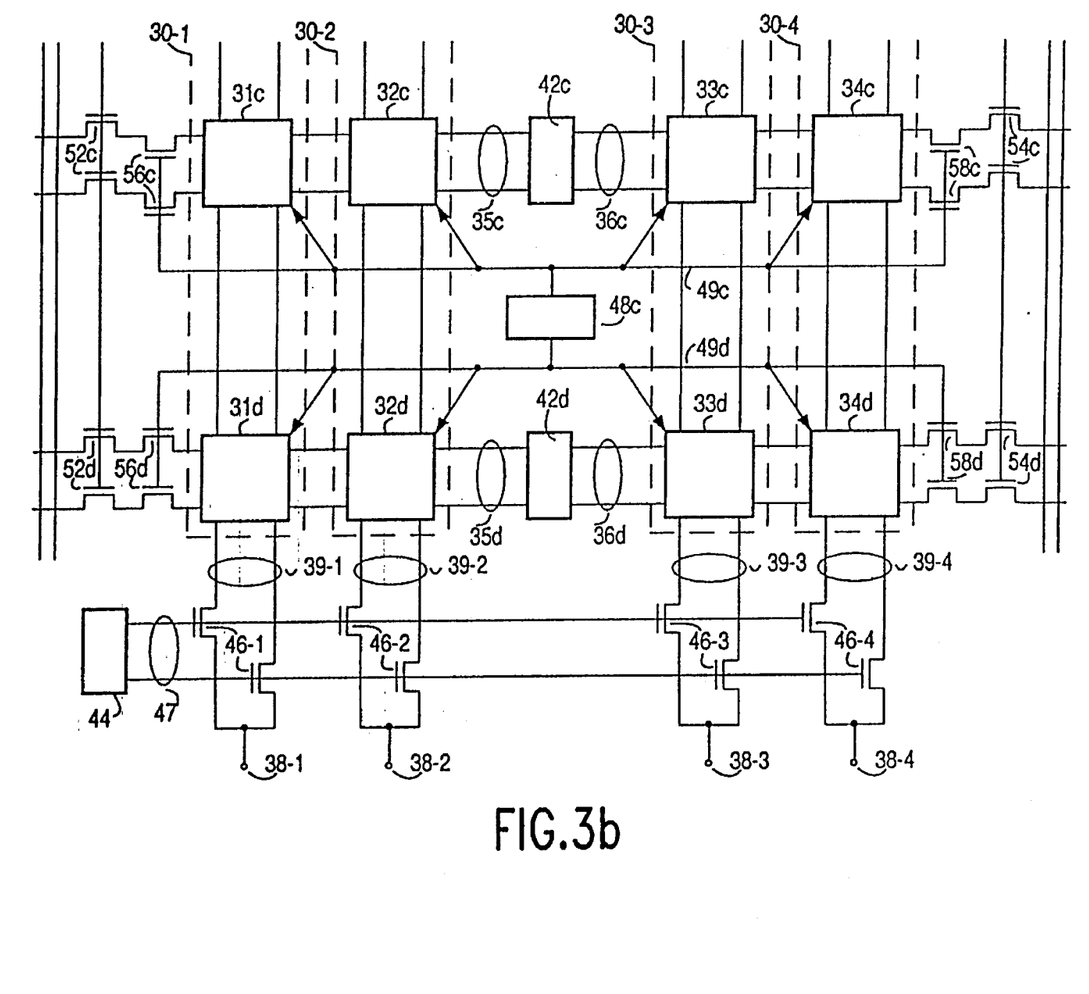

When the individual matrices 10-1 to 10-4 are very large, i.e. when they have a high capacity, for reasons of speed of operation it is attractive to subdivide each matrix into the same number of sub-matrices. FIGS. 3a and 3b together show such an arrangement (FIG. 3b being a continuation of FIG. 3a). There are again provided four matrices 30-1, 30-2, 30-3 and 30-4, each of which comprises four sub-matrices. More specifically, the matrix 30-1 comprises the sub-matrices 31a, 31b, 31c and 31d. Analogously, the matrix 30-2 comprises four sub-matrices 32a to 32d, the matrix 30-3 comprises four sub-matrices 33a to 33d, and the matrix 30-4 comprises four sub-matrices 34a to 34d. The sub-matrices thus themselves form a matrix again, a column of sub-matrices being each time associated with a matrix and a row of sub-matrices being formed by the sub-matrices of the same rank in all matrices.

The column conductors in each matrix successively traverse the sub-matrices, for example in the matrix 30-1 the column conductors 39-1 successively traverse the sub-matrices 31d, 31c, 31b and 31a. The row conductors, however, do not successively traverse all sub-matrices of a row of sub-matrices; the matrices are subdivided into two groups 30-1, 30-2 and 30-3, 30-4, the row decoder which in this case consists of four row decoders 42a, 42b, 42c and 42d being connected between these two groups. These row decoders have the same construction and are driven in parallel by the same address bits; however, for the sake of clarity this is not shown in this Figure. The row decoder 42a drives the row conductors 35a which successively traverse the sub-matrices 32a and 31a and, in parallel therewith, the row decoder 42a also drives the row conductors 36a which successively traverse the sub-matrices 33a and 34a. Similar row conductors 35a and 36a in the row decoder 42a may be connected directly to one another and to the output of a corresponding output amplifier of the row decoder 42a. Analogously, the row decoders 42b drive the row conductors 35b and 36b which successively traverse the sub-matrices 32b, 31b and 33b, 34b, respectively, and the same applies to the other row decoders and row conductors.

The arrangement shown in FIG. 3 also comprises a block decoder which in this case consists of two separate block decoders 48a and 48c which drive the block selection leads 49a, 49b, 49c and 49d so that each time only one of the four leads is driven. Each of the selection leads 49a to 49d activates controls the sub-matrices of the same rank of the four matrices; for example, a signal on the selection lead 49a activates the sub-matrices 31a, 32a, 33a and 34a. When the row decoders 42a to 42d receive a given address, these decoders all drive the same row conductors 35a to 35d and 36a to 36d, so that in all sub-matrices the same row of elements is addressed; however, the addressing of the row conductor is activated only in that row of sub-matrices which is selected by the block decoders 48a or 48c. Only the elements of this row conductor are connected to the corresponding column conductors 39-1 to 39-4. In the defect-free case, only one of these column conductors is selected by the selection transistors 46-1, 46-2, 46-3 and 46-4, driven by the column decoder 44 via the selection leads 47, so as to be connected to the output 38-1, 38-2, 38-3 or 38-4.

The individual elements in the matrices or sub-matrices are thus addressed in three ways, i.e. via the row decoders 42a, 42b, 42c and 42d and the row conductors connected thereto, via the block decoders 48a and 48c and the selection leads connected thereto, and via the column decoder 44. Thus, for testing the correct addressing all three decoders must be involved. Furthermore, the subdivision of the matrices 30-1 to 30-4 into two groups must be taken into account. In the arrangement shown in FIG. 3 this takes place on the one hand by providing two test buses 51 and 53. The test bus 51 is connected, via the series connection of the transistors 52a and 56a, to the row conductors 35 and, via the series connection of the transistors 52b and 56b, to the row conductors 35b and, via the series connection of the transistors 52c and 56c, to the row conductors 35c and, via the series connection of the transistors 52d and 56d, to the row conductors 35d. The transistors 52a to 52d are driven in common via the test lead 43. The transistors 56a, however, are driven by the block decoder 48a, via the block selection lead 49a. Analogously, the transistors 56b to 56d are driven via one of the block selection leads 49b to 49d. As a result, during testing either only the row conductors 35a or 35b or 35c or 35d are connected to the test bus 51, depending on the address bits supplied by the block decoders 48a and 48c.

The connection of the outputs of the transistors 52a to 52d to the conductors of the test bus 51 can then be realized as shown in the FIGS. 1a and 2a for the connection of the row conductors 15 to the test bus 21, but it is also attractive to select these connections to be different for the individual rows of sub-matrices such that the row conductors from different sub-matrices that are connectable to the same conductor of the test bus are selected by the row decoder in response to different addresses. The principle is indicated for example in FIG. 2b.

The test bus 51 is connected to the column conductors via the transistors 50-1 and 50-2, in this case only to the column conductors 39-1 and 39-2 of the matrices 30-1 and 30-2. These connections can again be established in a different manner, as shown in FIG. 2b, in order to facilitate optimum defect recognition and possibly also enable recognition of the type of defect.

For the matrices 30-3 and 30-4 there is provided the test bus 53 which is connected to the row conductors 36a via the series connection of the transistors 54a and 58a, to the row conductors 36b via the series connection of the transistors 54b and 58b, to the row conductors 36c via the transistors 54c and 58c, and to the row conductors 36d via the series connection of the transistors 54d and 58d. The transistors 54a to 54d are again driven together by a signal on the test lead 43, whereas the transistors 58a to 58d are separately driven, via a respective one of the block selection leads 49a to 49d, by a block decoder 48a, 48c, respectively. This construction is, therefore, symmetrical to the construction and the connection of the test bus 51. The test bus 51, is also connected to the column conductors 39-3 and 39-4 only via the transistors 50-3 and 50-4. The connection of the conductors of the test bus 53 to the transistors is preferably different for neighboring columns and rows of sub-matrices in the same way as for the test bus 51 and may correspond to the connections thereof.

The test buses 51 and 53 could in principle extend across the column conductors of all matrixes, notably when the number of column conductors is greater than the number of leads in the two test buses. However, this requires additional wiring without the possibility of defect recognition being substantially enhanced.

What is claimed is:

1. An integrated matrix memory comprising a circuit arrangement for testing the addressing of at a matrix, comprising storage elements which are arranged at intersections of row conductors and column conductors, the addressing taking place by way of a multibit address, via a decoder which comprises at least one row decoder and one column decoder, each of which is arranged to receive and decode a different part of the address bits and to drive each time a different row conductor or to select at least one column conductor, via selection switches, for connection to at least one output terminal, characterized in that the memory comprises a test bus and in that at the side of the matrix which is remote from the row decoder each row conductor can be coupled to a different conductor of the test bus and that at the side of the matrix which is remote from the selection switches each column conductor can be coupled to a different conductor of the test bus.

2. An integrated matrix memory, comprising:

storage elements;

an addressing device for addressing said storage elements, including row conductors and column conductors wherein an intersection of a row conductor with a column conductor defines a location of a storage element and wherein the row conductors traverse said matrix from a first side of said matrix to a third side of said matrix which third side is positioned opposite to said first side, and wherein the column conductors traverse said matrix from a second side of said matrix to a fourth side of said matrix which fourth side is positioned opposite to said second side;

a decoder for receiving a multi-bit address, including a row decoder coupled to said row conductors on the first side of said matrix for driving said row conductors, and a column decoder switchably coupled to said column conductors on the second side of said matrix, each decoder for decoding a different portion of said multi-bit address;

selection switches switchably coupling said column decoder to said column conductors on said second side of said matrix, said selection switches for selecting said column conductors in response to signals from said column decoder;

an output terminal switchably coupled to said column conductors through said selection switches; and a test bus having a plurality of different conductors, wherein at the third side of said matrix each row conductor is coupled to a respective different conductor of said test bus such that no two row conductors are coupled to the same conductor of said test bus, and at a fourth side of said matrix each column conductor is coupled to a respective different conductor of said test bus such that no two column conductors are coupled to the same conductor of said test bus.

3. A matrix memory as claimed in claim 2, comprising a plurality of matrices each having row conductors and column conductors wherein respective row conductors of at least some of said matrices are serially coupled together, and respective column conductors of at least some of said matrices are coupled such that if one of said column conductors of at least some of said matrices is selected by said column decoder a corresponding column conductor of at least some of said matrices is also selected by said column decoder, and wherein each of said selected column conductors need not be coupled to the same conductor of said test bus.

4. A matrix memory as claimed in claim 2, further including second test switches, wherein each column conductor is switchably coupled through said second switches to its respective different conductor of said test bus conductors, said second switches being drivable by a common test control signal.

5. A matrix as claimed in claim 4, wherein a plurality of column conductors are switchably and alternately coupled through said second test switches to the same conductor of said first test bus.

6. A matrix memory as claimed in claim 2, further including first test switches wherein each row conductor is switchably coupled through said first test switches to its respective different conductor of test bus conductors, the first test switches being drivable by a common test control signal.

7. A matrix memory as claimed in claim 6, further including second test switches, wherein each column conductor is switchably coupled through said second switches to its respective different conductor of said test bus conductors, said second switches being drivable by said common test control signal.

8. A matrix memory as claimed in claim 7, comprising a plurality of matrices each having row conductors and column conductors wherein respective row conductors of at least some of said matrices are serially coupled together, and respective column conductors of at least some of said matrices are coupled such that if one of said column conductors of at least some of said matrices is selected by said column decoder a corresponding column conductor of at least some of said matrices is also selected by said column decoder, and wherein each of said selected column conductors need not be coupled to the same conductor of said test bus.

9. A matrix as claimed in claim 6, wherein a plurality of row conductors are switchably and alternately coupled through said first test switches to the same conductor of said test bus.

10. A matrix memory as claimed in claim 6, comprising a plurality of matrices each having row conductors and column conductors wherein respective row conductors of at least some of said matrices are serially coupled together, and respective column conductors of at least some of said matrices are coupled such that if one of said column conductors of at least some of said matrices is selected by said column decoder a corresponding column conductor of at least some of said matrices is also selected by said column decoder, and wherein each of said selected column conductors need not be coupled to the same conductor of said test bus.

11. A matrix memory as claimed in claim 10, in which the matrices are distributed between two equally large groups and the row decoders are arranged between the two groups and control the row conductors for both groups in parallel, characterized in that said row decoders are coupled to first sides of each of said matrix groups and a respective test bus is provided at the third sides of both groups of matrices, which third sides are opposite to said first sides, and wherein each test bus coupled to at least a portion of the column conductors of the matrices.

12. A matrix memory as claimed in claim 10, wherein each matrix includes the same number of sub-matrices each sub-matrix of each matrix having corresponding row conductors and column conductors, and wherein each sub-matrix corresponds to a sub-matrix in another matrix, and wherein said row conductors of each sub-matrix are coupled in series to the row conductors of the corresponding sub-matrices in other matrices, and wherein each of said corresponding column conductors of each sub-matrix within a particular matrix are coupled in series, said matrix memory further including a block decoder for controlling in parallel the row conductors of said sub-matrices such that each time a row conductor is driven only one sub-matrix in each matrix is activated; and third test switches controllable by said block decoder for coupling each of said row conductors of said activated sub-matrices to a different conductor of said test bus such that two row conductors of the same activated sub-matrix are not connected to the same test bus conductor, however, two corresponding row conductors of different sub-matrices of a particular matrix need not be coupled to the same test bus conductor.

13. A matrix memory as claimed in claim 12, characterized in that said third test switches are connected in series with said first test switches.

14. A matrix memory as claimed in claim 13, in which the matrices are distributed between two equally large groups and the row decoders are arranged between the two groups and control the row conductors for both groups in parallel, characterized in that said row decoders are coupled to first sides of each of said matrix groups and a respective test bus is provided at the third sides of both groups of matrices, which third sides are opposite to said first sides, and wherein each test bus is coupled to at least a portion of the column conductors of the matrices.

15. A matrix memory as claimed in claim 12, in which the matrices are distributed between two equally large groups and the row decoders are arranged between the two groups and control the row conductors for both groups in parallel, characterized in that said row decoders are coupled to first sides of each of said matrix groups and a respective test bus is provided at the third sides of both groups of matrices, which third sides are opposite to said first sides, and wherein each test bus is coupled to at least a portion of the column conductors of the matrices.

16. A matrix memory as claimed in claim 10, wherein each matrix includes the same number of sub-matrices each sub-matrix of each matrix having corresponding row conductors and column conductors, and wherein each sub-matrix corresponds to a sub-matrix in another matrix, and wherein said row conductors of each sub-matrix are coupled in series to the row conductors of the corresponding sub-matrices in other matrices, and wherein each of said corresponding column conductors of each sub-matrix within a particular matrix are coupled in series, said matrix memory further including a block decoder for controlling corresponding sub-matrices in each matrix in parallel such that each time a row conductor is driven only one sub-matrix in each matrix is activated; and third test switches controllable by said block decoder for coupling each of said row conductors of said activated sub-matrices to a different conductor of said test bus such that two row conductors of the same activated sub-matrix are not connected to the same test bus conductor, however, two corresponding row conductors of different sub-matrices of a particular matrix need not be coupled to the same test bus conductor.

* * * * *